United States Patent
Isono

(10) Patent No.: US 9,870,972 B2
(45) Date of Patent: Jan. 16, 2018

(54) THERMOSETTING RESIN MOLDED ARTICLE

(71) Applicant: Fuji Electric Co., Ltd., Kawasaki-shi, Kanagawa (JP)

(72) Inventor: Miki Isono, Kawasaki (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 15/229,785

(22) Filed: Aug. 5, 2016

(65) Prior Publication Data

US 2017/0047263 A1    Feb. 16, 2017

(30) Foreign Application Priority Data

Aug. 13, 2015  (JP) .................................. 2015-159817
Jun. 14, 2016  (JP) .................................. 2016-118170

(51) Int. Cl.

| | |
|---|---|
| *H01L 23/31* | (2006.01) |
| *B32B 27/06* | (2006.01) |
| *B32B 15/08* | (2006.01) |
| *H01L 23/373* | (2006.01) |
| *H01L 23/29* | (2006.01) |

(Continued)

(52) U.S. Cl.
CPC .......... *H01L 23/3135* (2013.01); *B29C 39/00* (2013.01); *B32B 15/08* (2013.01); *B32B 27/06* (2013.01); *C08G 59/70* (2013.01); *H01L 21/4882* (2013.01); *H01L 23/16* (2013.01); *H01L 23/293* (2013.01); *H01L 23/3735* (2013.01); *B29C 45/14639* (2013.01); *B29K 2101/10* (2013.01); *B32B 2457/14* (2013.01); *H01L 2924/181* (2013.01)

(58) Field of Classification Search
CPC  H01L 23/3135; H01L 23/3735; H01L 23/293
See application file for complete search history.

(56) References Cited

U.S. PATENT DOCUMENTS

| | | | |
|---|---|---|---|
| 2012/0184640 A1* | 7/2012 | Kim ....................... | G02B 1/105 522/150 |
| 2012/0205816 A1* | 8/2012 | Son .................. | H01L 21/76898 257/774 |

(Continued)

FOREIGN PATENT DOCUMENTS

| | | | | |
|---|---|---|---|---|
| EP | 1265463 A2 * | 12/2002 | .......... | H05K 1/0373 |
| JP | 2009298875 A | 12/2009 | | |
| JP | 2017035874 A * | 2/2017 | | |

*Primary Examiner* — Earl Taylor
(74) *Attorney, Agent, or Firm* — Lerner, David, Littenberg, Krumholz & Mentlik, LLP

(57) ABSTRACT

A thermosetting resin molded article including: a metal member; a first thermosetting resin layer containing a chelating agent in an amount of 0.5% by mass or more; and a second thermosetting resin layer containing no chelating agent or containing a chelating agent in an amount of less than 0.5% by mass, in which the metal member, the first thermosetting resin layer, and the second thermosetting resin layer are stacked in this order is provided. A semiconductor device including: a semiconductor element mounted on a substrate and metal members, which are sealed with a sealant, in which the sealant includes: a first thermosetting resin layer stacked on the semiconductor element and the metal member; and a second thermosetting resin layer stacked on the first thermosetting resin layer is also provided.

17 Claims, 1 Drawing Sheet

(51) Int. Cl.
*H01L 21/48* (2006.01)
*H01L 23/16* (2006.01)
*B29C 39/00* (2006.01)
*C08G 59/70* (2006.01)
B29C 45/14 (2006.01)
B29K 101/10 (2006.01)

(56) References Cited

U.S. PATENT DOCUMENTS

| | | | | |
|---|---|---|---|---|
| 2012/0301824 | A1* | 11/2012 | Yoshida | G03F 7/0047 430/270.1 |
| 2013/0026660 | A1* | 1/2013 | Czubarow | H01L 23/293 257/788 |
| 2014/0150862 | A1* | 6/2014 | Liu | H01L 31/049 136/256 |
| 2014/0190545 | A1* | 7/2014 | Lei | H01L 31/0516 136/244 |
| 2015/0158221 | A1* | 6/2015 | Izumi | B29C 45/1671 361/679.01 |
| 2015/0366054 | A1* | 12/2015 | Okasaka | B32B 15/08 361/783 |
| 2017/0047263 | A1* | 2/2017 | Isono | H01L 23/3135 |
| 2017/0053847 | A1* | 2/2017 | Takematsu | H01L 23/295 |
| 2017/0233620 | A1* | 8/2017 | Suzuki | C09J 163/00 |
| 2017/0240744 | A1* | 8/2017 | Nakamata | C08L 79/085 |

* cited by examiner

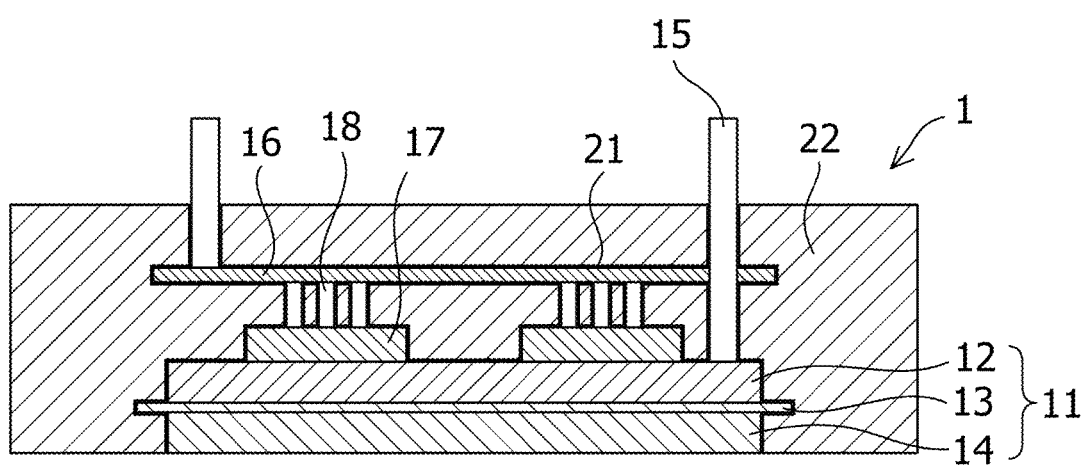

THERMOSETTING RESIN MOLDED ARTICLE

CROSS-REFERENCE TO RELATED APPLICATIONS

This Application claims priority from Japanese Patent Application No. 2015-159817 filed Aug. 13, 2015 and Japanese Patent Application No. 2016-118170 filed Jun. 14, 2016, the disclosures of which are incorporated herein by reference in their entirety.

FIELD OF THE INVENTION

The present invention relates to a thermosetting resin molded article and to a semiconductor device, as well as to methods of fabrication thereof.

BACKGROUND OF THE INVENTION

When a thermosetting resin is used as a sealant for a semiconductor package, the reliability of the package is affected by whether or not adhesion between the thermosetting resin and a metal material used for a substrate and wiring is favorable.

As a technique to improve the adhesion between a metal and a thermosetting resin, there is known a technique using a method that includes mixing the thermosetting resin with a chelating agent as an adhesion aid. For example, Japanese Patent Application Publication No. 2009-298875 proposes a resin composition that is obtained by mixing an epoxy resin with an aluminum chelate, thus having an improved adhesion to an aluminum substrate. The chelating agent is considered to improve the adhesion by interacting with a metal or a thermosetting resin.

However, the chelating agent acts also as a cross-linking agent for resins, the mixing of the chelating agent may sometimes embrittle the entire thermosetting resin. Particularly, when the thermosetting resin is used as a sealant for a semiconductor device, there is a concern that cracks will develop in the thermosetting resin due to a heating cycles. In view of the above circumstances, an object of the present invention is to obtain a resin molded article with improved crack resistance of a thermosetting resin while maintaining adhesion between a metal and the thermosetting resin.

BRIEF SUMMARY OF THE INVENTION

In one embodiment, the present invention provides a thermosetting resin molded article including: a metal member; a first thermosetting resin layer containing a chelating agent in an amount of 0.5% by mass or more; and a second thermosetting resin layer containing no chelating agent or containing a chelating agent in an amount of less than 0.5% by mass, in which the metal member, the first thermosetting resin layer, and the second thermosetting resin layer are stacked in this order.

In another embodiment, in a thermosetting resin molded article, the first thermosetting resin layer and/or the second thermosetting resin layer may include an epoxy resin composed of one or more types of molecules each having two or more epoxy groups.

In another embodiment, in the thermosetting resin molded article including the epoxy resin, the metal member may be a member composed mainly of any of tin, nickel, copper or aluminum.

In another embodiment, in the thermosetting resin molded article, the first thermosetting resin layer may contain a maleimide resin composed of one or more types of molecules each having one or more maleimide groups in one molecule.

In another embodiment, in the thermosetting resin molded article containing the maleimide resin, the metal member may be a member composed mainly of nickel or copper.

In another embodiment, in the thermosetting resin molded article, the metal member may include a hydroxyl group, which is directly bonded to a metal atom, in a surface thereof, which is in contact with the first thermosetting resin layer.

In another embodiment, in the thermosetting resin molded article, the chelating agent may be one or more selected from an aluminum-based chelate, a titanium-based chelate, and a zirconium-based chelate.

In another embodiment, in the thermosetting resin molded article, the chelating agent in the first thermosetting resin layer may be added in an amount of 0.5 to 10% by mass relative to a total mass of a thermosetting resin base material and a curing agent in the first thermosetting resin layer.

According to another embodiment, the present invention provides a semiconductor device including: a semiconductor element mounted on a substrate, and a metal member, which are sealed with a sealant, in which the sealant includes: a first thermosetting resin layer stacked on the semiconductor element and the metal member and containing a chelating agent in an amount of 0.5% by mass or more; and a second thermosetting resin layer stacked on the first thermosetting resin layer and containing no chelating agent or containing a chelating agent in an amount of less than 0.5% by mass.

According to another embodiment, the present invention provides a method of fabricating a thermosetting resin molded article, including the steps of: stacking a first thermosetting resin layer containing a chelating agent in an amount of 0.5% by mass or more on a metal member; and stacking a second thermosetting resin layer containing no chelating agent or containing a chelating agent in an amount of less than 0.5% by mass on the first thermosetting resin layer.

In another embodiment, the method of fabricating a thermosetting resin molded article may further include: a step of introducing a hydroxyl group into the metal member, before the step of stacking a first thermosetting resin layer.

In another embodiment, in the method of fabricating a thermosetting resin molded article, the first thermosetting resin layer may contain an epoxy resin and/or a maleimide resin.

Advantageously, some embodiments of the present invention make it possible to improve the crack resistance of the resin while maintaining the adhesion between the metal and the thermosetting resin. In addition, some embodiments of the present invention make it possible to provide a semiconductor device having excellent crack resistance and adhesion of the sealant and thus having improved reliability and service life of the product.

BRIEF DESCRIPTION OF THE DRAWINGS

FIG. 1 is a cross-sectional view of a semiconductor device, which is one example of a thermosetting resin molded article.

DETAILED DESCRIPTION

Embodiments of the present invention will be described with reference to the drawings. However, the present invention is not limited to the embodiments described below.

Thermosetting Resin Molded Article

An embodiment of the present invention is a thermosetting resin molded article formed by stacking a metal member, a first thermosetting resin layer, and a second thermosetting resin layer in this order.

The metal member included in the thermosetting resin molded article may be a member composed mainly of any of tin, nickel, copper and aluminum. Accordingly, the member may be a pure metal or an alloy composed mainly of any of these metals. The metal or alloy may be in bulk form or may be a metal member in which a plating film is formed on a base metal. For example, the metal member may be one in which a plating film of any of tin, nickel, and aluminum is provided on copper as a base, or may alternatively be one in which a metal film of any of tin, nickel, and aluminum is formed on copper by a CVD method, a vacuum deposition method, or a sputtering method.

The shape of the metal member is not particularly limited as long as the thermosetting resin layers can be formed on the metal member, and may be a plate shape, a bar shape, a sphere shape, or a line shape, or may alternatively be an irregular shape having a large number of curved surfaces and uneven portions. The dimensions of the metal member are also not particularly limited. Moreover, the metal member may be a member formed by combining two or more types of different metal members by any method. Further, the metal member may be configured to be electrically connected to any electric power source, or to come into contact with a heat source, thus undergoing temperature cycling.

The metal member may be one in which a surface thereof which is in contact with the first thermosetting resin layer has been surface-treated by a physical or chemical method, and is preferably one in which a hydroxyl group has been introduced directly to a metal atom contained in the metal member. For example, when the metal member is formed of pure copper, the surface of the metal member is preferably surface-treated to have a hydroxyl group directly bonded to a copper atom. A method of fabricating such a metal member into which a hydroxyl group has been introduced will be described later.

The first thermosetting resin layer is in contact with the metal member and stacked on the metal member. The first thermosetting resin layer includes a thermosetting resin containing a chelating agent in an amount of 0.5% by mass or more. As the thermosetting resin, an epoxy resin, a maleimide resin, a phenol resin, a urea resin, an unsaturated polyester resin, a melamine resin, or the like may be used.

Among them, the epoxy resin, or the maleimide resin, or a mixture of the epoxy resin and the maleimide resin, or a mixture of these resins with another resin is preferably used. Adding a predetermined amount of a chelating agent to the epoxy resin gives the epoxy resin adhesion to any surface of the metal member. Adding a predetermined amount of a chelating agent to the maleimide resin gives the maleimide resin high adhesion particularly to a surface of Ni, Cu, or any of these metals into which a hydroxyl group has been introduced.

As the epoxy resin, an epoxy resin that has at least two or more epoxy groups in one molecule is preferably used. Such epoxy resins include, for example, bisphenol AD, bisphenol F, bisphenol A resins in which an allyl group has been introduced, phenol novolac epoxy resins, cresol novolac epoxy resins, multifunctional epoxy resins, alicyclic epoxy resins, and the like; however, the epoxy resin is not limited to these. The epoxy resins may be used alone or a mixture of two or more of the epoxy resins may be used.

As the maleimide resin, resins that have a maleimide group, are liquid at ordinary temperature, and have a high glass transition temperature and a high heat resistance can be used. Among them, a monomaleimide resin and a bismaleimide resin are preferable, and a monomaleimide resin having a hydroxyl group is more preferable. The terminal group of the maleimide resin may be a hydrogen atom, or may be one to which a hydrogen atom or a hydroxyl group is bonded via an aromatic group. The aromatic group is a bivalent aromatic group, and may preferably be an aryl group having 6 to 20 carbon atoms, inclusive. The aryl group may be an unsubstituted aryl group, or may be a phenylene group substituted with a linear chain or branched alkyl group having 1 to 6 carbon atoms, inclusive, for example, a methyl group or an ethyl group. Examples of the maleimide resin having a hydroxyl group include N-phenyl(4-hydroxy)-maleimide and N-(2-methyl-4-hydroxyphenyl)maleimide; However, the maleimide resin having a hydroxyl group is not limited to these. On the other hand, examples of the monomaleimide resin having no hydroxyl group include N-phenyl maleimide (MPi) and N-(2 methyl phenyl) maleimide; however, the monomaleimide resin having no hydroxyl group is not limited to these.

When a mixture of an epoxy resin and a maleimide resin is used as a thermosetting resin base material, the epoxy resin and the maleimide resin may be mixed in any mass ratio depending on the purpose. For example, the mixture may be a mixture of the epoxy resin and the maleimide resin in an equivalent mass ratio. Alternatively, for example, for applications of bringing the mixture into contact with a metal member in which a hydroxyl group is directly bonded to a Ni atom or a Cu atom, which has high adhesion particularly with a maleimide, a mixture of an epoxy resin and a maleimide resin mixed in a mass ratio of 5:5 to 1:9 may be used; however, the mass ratio is not limited to these mass ratios.

When an epoxy resin is used as the thermosetting resin base material, examples of the curing agent include: amine-based curing agents, such as aliphatic diamines, aliphatic polyamines, aromatic amines, and cyclic amines, for example; imidazole-based curing agents; acid anhydride-based curing agents, such as aliphatic acid anhydrides, alicyclic acid anhydrides, and aromatic acid anhydrides, for example; polymercaptan-based curing agents, such as liquid polymercaptans, and polysulfide resins, and the like. These curing agents may be used alone or a mixture of two more of the curing agents may be used; however, the curing agent is not limited to these. In addition, when an acid anhydride is used as the curing agent, since curing reaction may be unlikely to occur with the curing agent alone, an amine may be added as a curing accelerator. Examples of the curing accelerator include tertiary amines (benzyl dimethyl amine and triethylene diamine) and imidazoles (2-methylimidazole and 2-ethyl-4-methylimidazole); however, the curing accelerator is not limited to these. When a maleimide resin is used as the thermosetting resin base material as well, a similar curing agent may be used. For example, an amine-based curing agent such as aromatic diamines including diamino diphenyl methane may be used, or a non-amine-based curing agent such as DABPA (4,4'-(dimethyl methylene)bis[2-(2-propenyl)phenol]) may also be used; however, the curing agent is not limited to these.

As the chelating agent, one type or a mixture of two or more types of aluminum-based chelates, titanium-based chelates, and zirconium-based chelates may be used. Accordingly, for example, two different types among the aluminum-based chelates may be used together, or an aluminum-based chelate and a titanium-based chelate may be used together. As the aluminum-based chelate, for example, aluminum ethylacetoacetate diisopropylate (ALCH), aluminum tris-(ethylacetoacetate) (ALCH-TR), aluminum alkylacetoacetate diisopropylate, aluminum bis-(ethylacetoacetate) mono-acetylacetonate, aluminum tris-(acetylacetonate), and the like may be used; however, the aluminum-based chelate is not limited to these. Such aluminum-based chelates are available from Kawaken Fine Chemicals Co., Ltd., and any of these may be used as appropriate. As the titanium-based chelate, for example, titanium acetylacetonate (TC-100), titanium tetra-acetylacetonate (TC-401), titanium ethylacetoacetate (TC-710), and the like may be used; however, the titanium-based chelate is not limited to these. As the zirconium-based chelate, zirconium tetra acetylacetonate (ZC-150), zirconium mono acetylacetonate (ZC-540), and the like may be used; however the zirconium-based chelate is not limited to these. The titanium-based chelates and the zirconium-based chelates listed above are available from Matsumoto Fine Chemicals Co., Ltd, and any of these may be used as appropriate. The chelating agent may be selected from the aluminum-based chelates, the titanium-based chelates, and the zirconium-based chelates as appropriate irrespective of the element constituting the metal member.

In the thermosetting resin constituting the first thermosetting resin layer, the first chelating agent is contained in an amount of 0.5% by mass or more relative to the total mass of the thermosetting resin and the curing agent, for example, is preferably contained in an amount of 0.5 to 10% by mass, and is further preferably contained in an amount of 1 to 5% by mass. This is because such a concentration range allows the chelating agent to form a monomolecular layer at, and adhere to, an interface with the metal member, thus being capable of achieving the highest adhesion. If the concentration of the chelating agent is too low, the chelating agent sometimes cannot sufficiently cover the interface with the metal member, while if the concentration of the chelating agent is too high, the layer of the chelating agent sometimes becomes too thick, rather lowering the adhesion.

The thickness of the first thermosetting resin layer may be 1 to 500 µm, or may preferably be 10 to 300 µm, for example, as the thickness after cure. This is because the first thermosetting resin layer is located at the interface between the metal member and the second thermosetting resin layer, and needs to have a thickness only sufficient to form a layer preferably formed of the monomolecular layer of the chelating agent at the interface, thereby tightly adhering them to each other. Meanwhile, if the thickness of the first thermosetting resin layer is too large, the strength of the thermosetting resin molded article is sometimes lowered.

The second thermosetting resin layer is stacked in contact with the first thermosetting resin layer, and is preferably provided such that the second thermosetting resin layer is not in contact with the metal member. The second thermosetting resin constituting the second thermosetting resin layer contains no chelating agent or contains a chelating agent in an amount of less than 0.5% by mass. This is because when the content of the chelating agent is less than 0.5% by mass relative to the total mass of the thermosetting resin and the curing agent, an influence of reduction in strength of the second thermosetting resin layer is very small. When the second thermosetting resin contains a chelating agent, the chelating agent may be selected from a range similar to the preferable chelating agents added to the first thermosetting resin, or may be a chelating agent other than these. In addition, the chelating agent that may be contained in the second thermosetting resin may be the same as, or may be different from, the chelating agent added to the first thermosetting resin. The content of the chelating agent in the second thermosetting resin is preferably less than 0.3% by mass, more preferably less than 0.1% by mass, and most preferably the second thermosetting resin contains no chelating agent. The second thermosetting resin included in the second thermosetting resin layer may be selected from thermosetting resins similar to those given for illustrating the thermosetting resin constituting the first thermosetting resin layer, for example, the thermosetting resin base material, the curing agent, and optionally the curing accelerator, except the content of the chelating agent. Thus, the second thermosetting resin may have the same composition as that of the first thermosetting resin except the chelating agent, or the second thermosetting resin may be a different type of a thermosetting resin from the first thermosetting resin. Thus, the second thermosetting resin may be an epoxy resin, a maleimide resin, a mixture thereof, or any other thermosetting resin, for any type of the first thermosetting resin.

In addition, the second thermosetting resin layer may contain a microfiller or a nanofiller formed, for example, of inorganic particles of silica, alumina, boron nitride, aluminum nitride, or the like, as an inorganic filler, depending on its purpose. In a case in which the inorganic filler is a microfiller, the inorganic filler is preferably contained in an amount of 10 to 90 parts by mass, more preferably contained in an amount of 10 to 70 parts by mass, and further preferably contained in an amount of 15 to 50 parts by mass, when the total mass of the thermosetting resin base material and the curing agent is assumed to be 100 parts by mass. Moreover, in a case in which the inorganic filler is a nanofiller, the inorganic filler is preferably contained in an amount of 1 to 50 parts by mass, and further preferably contained in an amount of 5 to 20 parts by mass, when the total mass of the thermosetting resin base material and the curing agent is assumed to be 100 parts by mass.

The thickness of the second thermosetting resin layer is not particularly limited, and may be determined as appropriate depending on the purpose or application of the thermosetting resin molded article. Moreover, in addition to the second thermosetting resin layer, the thermosetting resin molded article according to the present invention may be provided with a further different type of a resin layer in contact with the second thermosetting resin layer.

Next, the thermosetting resin molded article according to the present invention will be described in terms of a method of fabricating the same. A method of fabricating the thermosetting resin molded article includes: a first step of stacking a first thermosetting resin layer on a metal member; and a second step of stacking a second thermosetting resin layer on the first thermosetting resin layer.

In the first step, a first thermosetting resin is stacked on a metal member. First, a pre-cured composition for the first thermosetting resin can be prepared by mixing a thermosetting resin base material, a curing agent, a chelating agent, and optionally a curing accelerator and various additives, followed by stirring for 10 to 30 minutes at room temperature. Then, the pre-cured composition can be applied and stacked in a desired thickness onto the metal member by immersing the metal member into the pre-cured composition, or by any of various coating methods such as spin coating. Next, the metal member with the pre-cured composition stacked thereon is heated for curing at a curing temperature of the first thermosetting resin or more. The curing here has to be made only to such an extent the first thermosetting resin layer and a second thermosetting resin layer to be stacked subsequently will not be mixed with each other, and complete curing may not be necessary. The curing conditions at this time may be, for example, such that the metal member with the pre-cured composition is held for about 30 minutes to 1 hour at any temperature from 80 to 150° C.

In the second step, the second thermosetting resin layer is stacked on the first thermosetting resin layer. Specifically, a pre-cured composition for the second thermosetting resin is applied and stacked onto the first thermosetting resin layer obtained in the first step, and is then cured. The applying method at this time may be the same as that in the first step, or sometimes when a thicker layer is to be formed, transfer molding or potting may be employed. The curing conditions at this time may be, for example, such that the first thermosetting resin layer with the pre-cured composition is held for about 30 minutes to 1 hour at any temperature from 80 to 150° C., and thereafter held for about 1 to 10 hours at any temperature from about 100 to 200° C. In this way, the thermosetting resin molded article of the present invention can be obtained. Note that in both of the first step and the second step, appropriate conditions may be selected for the curing temperature and time, depending on the types of the thermosetting resin and the curing agent, the curing conditions are not limited to the above-described ranges.

Optionally, a step of introducing a hydroxyl group into the metal member may be performed before the first step. As a method of forming a hydroxyl group in a surface of the metal member, for example, in a case in which the metal member is of tin, the metal member formed of tin is immersed in a tin chloride aqueous solution, and an alkaline aqueous solution such as aqueous ammonia is added thereto. Thereafter, the metal member formed of tin is taken out of the solution, and is held for 1 to 3 hours under vacuum at about 1 to 10 Torr, or is heated for 0.5 to 1 hour at a temperature from room temperature to 50° C., thereby being dried. This process removes water adsorbed in the metal surface, and introduces a hydroxyl group into the metal surface. As a result, an OH group, which is directly bonded to the metal atoms, can be generated (a hydroxide can be formed). Also in a case in which the metal member is formed of nickel, aluminum, copper, or an alloy composed mainly of any of these, it is possible to similarly introduce a hydroxyl group into the surface of the metal member by immersing the metal into a corresponding metal salt aqueous solution, adding an alkali aqueous solution, and thereafter holding the metal member under vacuum or heating to dry the metal member. Note that the method of introducing a hydroxyl group may be another well-known method, and is not limited to the method described above.

According to the thermosetting resin molded article and the method of fabricating the same of this embodiment, it is possible to obtain a thermosetting resin molded article having a high adhesion between a metal member and a thermosetting resin, and having an improved crack resistance of the thermosetting resin after a heat cycle.

Semiconductor Device

According to a certain embodiment, the present invention relates to a semiconductor device including the above-described thermosetting resin molded article as a part of constituent elements and being sealed with a sealant. FIG. 1 shows a concept cross-sectional view of the semiconductor device according to this embodiment. This semiconductor device may be, for example, a power module for use in applications in which a large current flows, but is not particularly limited.

FIG. 1 is a view showing a cross-sectional structure of a semiconductor module 1. In the semiconductor module 1, an insulating substrate 11 includes: a first copper block 14 having a substantially rectangular parallelepiped shape and being disposed on a lower surface, which is one surface, of an insulating layer 13; and a second copper block 12 having a substantially rectangular parallelepiped shape and being disposed on an upper surface, which is another surface, of the insulating layer 13. A plurality of SiC power semiconductor elements 17 are mounted and attached to an upper surface, which is a surface on the second copper block 13 side, of the insulating substrate 11 via a conductive joint layer, which is not shown. Moreover, an implanted printed board 16 including implant pins 18 is attached to upper surfaces of the SiC power semiconductor elements 17 via conductive joint layers, which are not shown. External connection terminals 15 are attached to an upper surface of the implanted printed board 16 and an upper surface of the second copper block 12, thereby allowing for electrical connection with an outside of the semiconductor module 1. The surfaces of these members are covered with a first thermosetting resin layer 21. The first thermosetting resin layer 21 is further sealed with a second thermosetting resin layer 22, thereby constituting the semiconductor module 1. Note that in this Description, the terms "upper surface" and "lower surface" are only relative terms indicating up and down in the figure, for the purpose of illustration, and do not limit up and down in relations with the mode of usage of the semiconductor module, and the like. In addition, each of the first thermosetting resin layer 21 and the second thermosetting resin layer 22 has aspects as described above for the thermosetting resin molded article.

Among the members constituting the semiconductor module 1, examples of the metal member which is in contact with the sealant include the upper surface of the second copper block 13, electrodes of the SiC power semiconductor elements 17, the implant pins 18, a wiring portion of the implanted printed board 16, and the external connection terminal 15. Accordingly, the first thermosetting resin layer 21 is stacked on at least the surfaces of these metal members to cover the surfaces of the metal members. As described above for the thermosetting resin molded article, the first thermosetting resin layer 21 preferably has a thickness only sufficient to allow the chelating agent to form a monomolecular layer generally at, and adhere to, an interface with each metal member. The second thermosetting resin layer 22 constitutes a large part of the sealant. The second thermosetting resin layer 22 preferably contains an inorganic filler and an additive which could be added to a normal sealant for semiconductor devices, and preferably contains an inorganic filler in an amount as described above for the thermosetting resin molded article.

A method of fabricating such a semiconductor module 1 is as follows. In accordance with the conventional techniques, the semiconductor element 17 is mounted on the insulating substrate 11, and the implant pins 18, the implanted printed board 16, and the external connection terminal 15 are attached thereto. Thereafter, these are immersed into the pre-cured composition for the first thermosetting resin to stack the first thermosetting resin layer 21 containing the chelating agent on the surfaces of the metal members. Alternatively, the pre-cured composition for the first thermosetting resin may be applied only to the surfaces of desired metal member by using a brush or a dropper. After curing under predetermined conditions, the pre-cured composition for the second thermosetting resin is degassed under vacuum by an ordinary method, followed by sealing and curing. As a result, the semiconductor module 1 according to the embodiment of the present invention can be fabricated.

As another mode, although not shown in the drawing, a semiconductor module having another configuration can be given. Specifically, there can be given a semiconductor module that includes an insulating substrate sandwiched by two upper and lower electrodes on a copper base, in which a plurality of semiconductor elements may be mounted on the upper electrode of the insulating substrate, these semiconductor elements are connected by means of aluminum wires (wire bonding), copper wiring (a copper bar) is drawn out from the upper electrode, and the semiconductor elements, the two electrodes, the insulating substrate are sealed with a sealant. Such a configuration is favorably employed for a semiconductor module in which a Si power semiconductor element is mounted. In this configuration, the first thermosetting resin layer may be stacked for example on the upper electrode of the insulating substrate, the electrode of the semiconductor element, the aluminum wire, and the copper wiring, which are metal members constituting the semiconductor device, and the second thermosetting resin layer is stacked on the first thermosetting resin layer for sealing. As another configuration, for example, in the case of a semiconductor device including a metal-made lead frame, it is preferable to stack the first thermosetting resin layer on the surface of the lead frame. These metal members constituting semiconductor devices are often made of copper, aluminum, nickel, or tin, or are members plated with any of these metals. For any of these metals, the first thermosetting resin layer according to the present invention provides an effect of adhesion, thus being capable of enhancing the adhesion between the sealant and a sealed member as a whole. Alternatively, optionally, a hydroxyl group may be introduced into these metal members to enhance their adhesion. The advantageous effects achieved by introducing a hydroxyl group is great in the adhesion between nickel, which is used for a member requiring durability, and the first thermosetting resin layer containing a maleimide resin. This makes it possible to enhance the durability of the semiconductor device.

Hereinbelow, the present invention will be described in more details by giving Examples of the present invention; however, the present invention is not limited to the scopes of Examples described below.

EXAMPLE 1

The thermosetting resin molded article according to the present invention was fabricated and evaluated in terms of adhesion and crack resistance.

For the first thermosetting resin, a multifunctional epoxy (jER630 available from Mitsubishi Chemical Corporation), an amine (jERCURE113 available from Mitsubishi Chemical Corporation), and aluminum ethylacetoacetate diisopropylate (ALCH available from Kawaken Fine Chemicals Co., Ltd.) were used as the thermosetting resin base material, the curing agent, and the chelating agent, respectively. The pre-cured composition for the first thermosetting resin was prepared by mixing 50 g of the curing agent and 4.5 g of the chelating agent with 100 g of the thermosetting resin base material, followed by stirring for 20 minutes at room temperature. The pre-cured composition for the second thermosetting resin containing no chelating agent was prepared by mixing the same thermosetting resin base material and curing agent as those of the first thermosetting resin, and no chelating agent was added thereto.

A thermosetting resin molded article to be used as a specimen for evaluation of adhesion was fabricated. As the metal member, one obtained by plating a copper plate of 100 mm×15 mm×3 mm with matte tin in 10 μm was used. In the first step, the pre-cured composition for the first thermosetting resin was applied to the metal member by spin coating to form the first thermosetting resin layer. The thickness of the first thermosetting resin layer was 100 μm (after curing). This metal member with the first thermosetting resin layer was held for 1 hour at 120° C. to obtain the primary molded article. In the second step, the pre-cured composition for the second thermosetting resin was applied to the primary molded article obtained in the first step by spin coating to form the second thermosetting resin layer. The thickness of the second thermosetting resin layer was 300 μm (after curing).

On the second thermosetting resin layer of a stacked body obtained by applying the second thermosetting resin layer to the primary molded article, another metal member obtained by plating a copper plate with matte tin was placed such that they overlap each other in an area of 10 mm×15 mm, and was fixed by using a clip to obtain a specimen for tensile shear test. The specimen was held for 1 hour at 120° C., and then for 10 hours at 200° C. to obtain a final molded article.

As a specimen for checking the presence or absence of cracks in a heat cycle test, a primary molded article provided with the first thermosetting resin layer was obtained as follows: a metal member was obtained by plating a copper plate of 50 mm×50 mm×3 mm with matte tin in 10 μm, the pre-cured composition for the first thermosetting resin was applied to the metal member in a thickness of 50 μm by spin coating, and then the metal member with the pre-cured composition was held for 1 hour at 120° C. Next, the pre-cured composition for the second thermosetting resin was stacked in a thickness of 1 cm on the primary molded article thus obtained, and the the pre-cured composition with the pre-cured composition was held for 1 hour at 120° C., and then for 10 hours at 200° C. to obtain a final molded article.

EXAMPLE 2

As the metal member, one obtained by plating a copper plate with electroless nickel in 15 μm instead of the matte tin plating in Example 1 was used. The other conditions were the same as those in Example 1.

EXAMPLE 3

As the metal member, an aluminum plate with no plating was used. The other conditions were the same as those in Example 1.

EXAMPLE 4

As the metal member, a copper plate was used as it is without plating. The other conditions were the same as those in Example 1.

COMPARATIVE EXAMPLES 1 to 8

Thermosetting resin molded articles of single layer structures were fabricated as Comparative Examples by stacking only a first thermosetting resin layer, or only a second thermosetting resin containing no chelating agent, on the same metal members as those in Examples 1 to 4. The curing conditions were 1 hour at 120° C. and then 10 hours at 200°

C. Specimens for evaluation of adhesion were each fabricated such that the thickness of one layer was 400 μm. On the other hand, specimens for the heat cycle test were each fabricated such that the thickness of one layer was 1 cm. The other conditions were the same as those in Examples.

EXAMPLE 5

A specimen for evaluation of adhesion and a specimen for heat cycle test were fabricated in the same manner as that for the combination of the metal member and the thermosetting resins in Example 1 except that a process of introducing a hydroxyl group into the metal member was performed. The introduction of the hydroxyl group was performed by the following method. The above-described metal member was immersed into 0.5 mol/l of a tin chloride aqueous solution, and 0.1 mol/l of aqueous ammonia in an amount of 5% by volume of the tin chloride aqueous solution was added, followed by gently stirring several times. After being left to stand for 5 minutes, the metal member was taken out, and was held for 2 hours under vacuum at 5 Torr. In this way, the hydroxyl group was introduced into the surface of the metal member obtained by plating the copper plate with matte tin.

EXAMPLE 6

A specimen for evaluation of adhesion and a specimen for heat cycle test were fabricated in the same manner as that for the combination of the metal member and the thermosetting resins in Example 2 except that a process of introducing a hydroxyl group into the metal member was performed. The introduction of the hydroxyl group was performed in the same manner as that in Example 5 except that a nickel chloride aqueous solution was used instead of the tin chloride aqueous solution in Example 5.

EXAMPLE 7

A specimen for evaluation of adhesion and a specimen for heat cycle test were fabricated in the same manner as that for the combination of the metal member and the thermosetting resins in Example 3 except that a process of introducing a hydroxyl group into the metal member was performed. The introduction of the hydroxyl group was performed in the same manner as that in Example 5 except that an aluminum chloride aqueous solution was used instead of the tin chloride aqueous solution in Example 5.

EXAMPLE 8

A specimen for evaluation of adhesion and a specimen for heat cycle test were fabricated in the same manner as that for the combination of the metal member and the thermosetting resins in Example 4 except that a process of introducing a hydroxyl group into the metal member was performed. The introduction of the hydroxyl group was performed in the same manner as that in Example 5 except that a copper chloride aqueous solution was used instead of the tin chloride aqueous solution in Example 5.

The tensile shear test was performed on each of the specimens of Examples 1 to 8 and Comparative Examples 1 to 8 to evaluate the value of the maximum stress. The shear tensile test was performed at a tensile speed of 10 mm/min by using AUTOGRAPH AG-X (available from Shimazu Corporation). In addition, the heat cycle test was performed to evaluate the presence or absence of cracks, where the heat cycle is set such that each specimen was held for 30 minutes at −40° C. and held for 30 minutes at 150° C. on a high temperature side in one cycle, and this cycle was repeated 1000 times. The presence or absence of cracks on the surface of the specimen after 1000 cycles were performed was visually determined to evaluate the crack resistance. The evaluation criterion for the crack resistance in the table given below was set such that when a crack occurrence rate (%), which was calculated by (the number of samples in which any crack occurred)/(the total number of samples), is less than 10%, the specimen passed the test, while when the crack occurrence rate (%) was more than or equal to 10%, the specimen failed the test. The total number of samples was 100.

In each Example, the crack resistance was comparable and the adhesion was high as compared to Comparative Examples 1 to 4, while the adhesion was comparable and the crack resistance was improved as compared to Comparative Examples 5 to 8. Moreover, the adhesions in Examples 5 to 8 were further higher than those of Examples 1 to 4. The results are shown in Table 1.

TABLE 1

| | Structure of Metal/Resin | Maximum Stress [MPa] | Crack Resistance |
|---|---|---|---|
| Example 1 | Tin/First Thermosetting Resin/Second Thermosetting Resin | 10 | Passed |
| Example 2 | Nickel/First Thermosetting Resin/Second Thermosetting Resin | 13 | Passed |
| Example 3 | Aluminum/First Thermosetting Resin/Second Thermosetting Resin | 20 | Passed |
| Example 4 | Copper/First Thermosetting Resin/Second Thermosetting Resin | 15 | Passed |
| Example 5 | Tin (OH group)/First Thermosetting Resin/Second Thermosetting Resin | 13 | Passed |
| Example 6 | Nickel (OH group)/First Thermosetting Resin/Second Thermosetting Resin | 15 | Passed |
| Example 7 | Aluminum (OH group)/First Thermosetting Resin/Second Thermosetting Resin | 25 | Passed |
| Example 8 | Copper (OH group)/First Thermosetting Resin/Second Thermosetting Resin | 18 | Passed |
| Comparative Example 1 | Tin/Second Thermosetting Resin | 5 | Passed |
| Comparative Example 2 | Nickel/Second Thermosetting Resin | 7 | Passed |
| Comparative Example 3 | Aluminum/Second Thermosetting Resin | 10 | Passed |
| Comparative Example 4 | Copper/Second Thermosetting Resin | 9 | Passed |
| Comparative Example 5 | Tin/First Thermosetting Resin | 9 | Failed |
| Comparative Example 6 | Nickel/First Thermosetting Resin | 15 | Failed |
| Comparative Example 7 | Aluminum/First Thermosetting Resin | 23 | Failed |
| Comparative Example 8 | Copper/First Thermosetting Resin | 12 | Failed |

EXAMPLE 9

The semiconductor module shown in FIG. 1 was fabricated. The semiconductor elements were mounted on a substrate, and the implant pins, the printed board, and the external terminals were attached thereon. The above-described semiconductor module before sealing was immersed into the pre-cured composition for the first thermosetting resin containing the chelating agent used in the first step of Example 1, and after being taken out, the semiconductor module was held for 1 hour at 120° C. to obtain a primary molded article. Next, the pre-cured composition for the second thermosetting resin containing no chelating agent used in the second step of Example 1 was prepared for the primary molded article, and the primary molded article was sealed by using a mold. The curing conditions for the second thermosetting resin were 1 hour at 120° C. and then 10 hours at 200° C.

COMPARATIVE EXAMPLE 9

The pre-cured composition for the first thermosetting resin containing the chelating agent was prepared for a semiconductor module before sealing, which had the same configuration as that of Example 9, and the semiconductor module was sealed by using a mold.

When the heat cycle test was performed on the semiconductor devices fabricated in Example 9 and Comparative Example 9 under the above-described conditions, cracks occurred in the resin-sealed portion of Comparative Example 9 while no cracks occurred in Example 5.

EXAMPLE 10

A thermosetting resin molded article was fabricated in the same manner as that for Example 1, and was evaluated in terms of adhesion and crack resistance. For the first thermosetting resin, a maleimide resin (BMI-2300 available from Daiwa Kasei Industry Co., Ltd.) was used as the thermosetting resin base material, and DDM (available from ThreeBond Co., Ltd.) was used as the curing agent. The same chelating agent as in Example 1 was used. Then, 25 g of the curing agent and 4.5 g of the chelating agent were mixed to 100 g of the base material, followed by stirring for 20 minutes at room temperature to prepare the pre-cured composition for the first thermosetting resin. As the pre-cured composition for the second thermosetting resin containing no chelating agent, one obtained from the same epoxy resin as in Example 1 was used. The other conditions, not particularly mentioned here, were the same compositions as those in Example 1.

A thermosetting resin molded article to be used as a specimen for evaluation of adhesion was fabricated. As the metal member, one obtained by plating a copper plate of 100 mm×15 mm×3 mm with electroless nickel in 15 µm, and introducing an OH group, which was directly bonded to Ni, was used. In the first step, the pre-cured composition for the first thermosetting resin was applied to the metal member by spin coating to form the first thermosetting resin layer. The thickness of the first thermosetting resin layer was 100 µm (after curing). This metal member with the first thermosetting resin layer was held for 3 hours at 150° C. to obtain the primary molded article. In the second step, the pre-cured composition for the second thermosetting resin was applied to the primary molded article obtained in the first step by spin coating to form the second thermosetting resin layer. The thickness of the second thermosetting resin layer was 300 µm (after curing). On the second thermosetting resin layer of a stacked body obtained by applying the second thermosetting resin layer to the primary molded article, another metal member obtained by plating a copper plate with electroless nickel was placed such that they overlap each other in an area of 10 mm×15 mm, and was fixed by using a clip to obtain a specimen for tensile shear test. The specimen was held for 1 hour at 120° C., and then for 10 hours at 200° C. to obtain a final molded article.

As a specimen for checking the presence or absence of cracks in a heat cycle test, a primary molded article provided with the first thermosetting resin layer was obtained as follows: a metal member was obtained by plating a copper plate of 50 mm×50 mm×3 mm with electroless nickel in 15 µm and further introducing an OH group, which was directly bonded to Ni, the pre-cured composition for the first thermosetting resin was applied to the metal member in a thickness of 50 µm by spin coating, and then the metal member with the pre-cured composition was held for 3 hour at 150° C. Next, the pre-cured composition for the second thermosetting resin was stacked in a thickness of 1 cm on the primary molded article thus obtained, and the primary molded article with the pre-cured composition was held for 1 hour at 120° C., and then for 10 hours at 200° C. to obtain a final molded article.

EXAMPLE 11

A thermosetting resin molded article of Example 11 was fabricated in the same manner as that in Example 10 except that the thermosetting resin base material constituting the first thermosetting resin was replaced with a mixture of an epoxy resin and a maleimide resin in a mass ratio of 1:1. The same base material for the epoxy resin as that used in Example 1 and the same base material for the maleimide resin as that used in Example 10 were used.

COMPARATIVE EXAMPLE 10

A thermosetting resin molded article having a single layer structure was fabricated as a Comparative Example by stacking only a first thermosetting resin layer on the same metal member as that in Example 10. The composition of the first thermosetting resin layer was the same as that of the first thermosetting resin layer in Example 10. The curing conditions were 1 hour at 120° C. and then 10 hours at 200° C. Like Comparative Examples 1 to 8, the specimen for evaluation of adhesion was fabricated such that the thickness of one layer was 400 µm while the specimen for heat cycle test was fabricated such that the thickness of one layer was 1 cm. The other conditions were the same as those in Example 10.

COMPARATIVE EXAMPLE 11

A thermosetting resin molded article of Comparative Example 11 was fabricated in the same manner as that in Comparative Example 10 except that the thermosetting resin base material constituting the first thermosetting resin was replaced with a mixture of an epoxy resin and a maleimide resin in a mass ratio of 1:1. The types and compositions of the epoxy resin, the maleimide resin, and the chelating agent were the same as those in Example 11.

The tensile shear test and the heat cycle test were performed on the specimens of Examples 10, 11 and Comparative Examples 10, 11 in the same manner as that in which these tests were performed on the specimens of Examples 1 to 8 and Comparative Examples 1 to 8. The same evaluation criterion was also used. The results are shown in Table 2. It was found that when the metal member was particularly a Ni-plated member into which an OH group was introduced, the use of the maleimide resin as the first thermosetting resin resulted particularly in high maximum stress and high adhesion. Although data is not shown, also when the metal member was a Cu member into which an OH group was introduced, the use of the maleimide resin as the first thermosetting resin provided greater effect of an improvement in adhesion than the case of using the epoxy resin as the first thermosetting resin.

TABLE 2

| | Structure of Metal/Resin | Maximum Stress [MPa] | Crack Resistance |
|---|---|---|---|
| Example 10 | Nickel (OH group)/First Thermosetting Resin (Maleimide)/Second Thermosetting Resin (Epoxy) | 20 | Passed |
| Example 11 | Nickel (OH group)/First Thermosetting Resin (Maleimide + Epoxy)/Second Thermosetting Resin (Epoxy) | 15 | Passed |
| Comparative Example 10 | Nickel (OH group)/First Thermosetting Resin | 20 | Failed |
| Comparative Example 11 | Nickel (OH group)/First Thermosetting Resin | 15 | Failed |

From these results, it was found that the thermosetting resin molded articles according to the present invention are capable of achieving both good adhesion between the thermosetting resin and the metal member and good crack resistance of the thermosetting resin. In addition, it was possible to further improve the adhesion between the thermosetting resin and the metal member particularly by introducing a hydroxyl group into the metal member.

REFERENCE SIGNS LIST 1 semiconductor module
11 insulating substrate
12 second copper block
13 insulating layer
14 first copper block
15 external connection terminal
16 implanted printed board
17 SiC semiconductor element
18 implant pin
21 first thermosetting resin layer
22 second thermosetting resin layer

The invention claimed is:

1. A thermosetting resin molded article comprising:
a first thermosetting resin layer containing a first chelating agent in an amount of 0.5% by mass or more; and
a second thermosetting resin layer containing no chelating agent or containing a second chelating agent in an amount of less than 0.5% by mass,
wherein the first thermosetting resin layer is stacked on a metal member and the second thermosetting resin layer is stacked on the first thermosetting resin layer.

2. The thermosetting resin molded article according to claim 1, wherein the first thermosetting resin layer and/or the second thermosetting resin layer comprises an epoxy resin including one or more types of molecules each having two or more epoxy groups.

3. The thermosetting resin molded article according to claim 2, wherein the metal member is composed mainly of any one of tin, nickel, copper or aluminum.

4. The thermosetting resin molded article according to claim 1, wherein the first thermosetting resin layer contains a maleimide resin composed of one or more types of molecules having one or more maleimide groups.

5. The thermosetting resin molded article according to claim 2, wherein the first thermosetting resin layer contains a maleimide resin composed of one or more types of molecules having one or more maleimide groups.

6. The thermosetting resin molded article according to claim 4, wherein the metal member is composed mainly of nickel or copper.

7. The thermosetting resin molded article according to claim 5, wherein the metal member is composed mainly of nickel or copper.

8. The thermosetting resin molded article according to claim 1, wherein the metal member comprises a hydroxyl group, which is directly bonded to a metal atom, in a surface thereof, which is in contact with the first thermosetting resin layer.

9. The thermosetting resin molded article according to claim 2, wherein the metal member comprises a hydroxyl group, which is directly bonded to a metal atom, in a surface thereof, which is in contact with the first thermosetting resin layer.

10. The thermosetting resin molded article according to claim 4, wherein the metal member comprises a hydroxyl group, which is directly bonded to a metal atom, in a surface thereof, which is in contact with the first thermosetting resin layer.

11. The thermosetting resin molded article according to claim 1, wherein the first chelating agent comprises an aluminum-based chelate, a titanium-based chelate, and/or a zirconium-based chelate.

12. The thermosetting resin molded article according to claim 1, wherein the first chelating agent is added in an amount of 0.5 to 10% by mass relative to a total mass of a thermosetting resin base material and a curing agent in the first thermosetting resin layer.

13. A semiconductor device comprising: a semiconductor element mounted on a substrate, and a metal member, which are sealed with a sealant, wherein the sealant includes:
a first thermosetting resin layer stacked on the semiconductor element and the metal member, wherein the first thermosetting resin layer contains a first chelating agent in an amount of 0.5% by mass or more; and
a second thermosetting resin layer stacked on the first thermosetting resin layer, wherein the second thermosetting resin layer contains no chelating agent or a second chelating agent in an amount of less than 0.5% by mass.

14. A method of fabricating a thermosetting resin molded article comprising:
stacking a first thermosetting resin layer containing a first chelating agent in an amount of 0.5% by mass or more on a metal member; and
stacking a second thermosetting resin layer containing no chelating agent or containing a second chelating agent in an amount of less than 0.5% by mass on the first thermosetting resin layer.

15. The method according to claim 14, further comprising:
introducing a hydroxyl group into the metal member before stacking a first thermosetting resin layer.

16. The method according to claim 14, wherein the first thermosetting resin layer contains an epoxy resin and/or a maleimide resin.

17. The method according to claim 15, wherein the first thermosetting resin layer contains an epoxy resin and/or a maleimide resin.

* * * * *